United States Patent [19]

Hawrylo

[11] Patent Number: 4,479,222
[45] Date of Patent: Oct. 23, 1984

[54] DIFFUSION BARRIER FOR LONG WAVELENGTH LASER DIODES

[75] Inventor: Frank Z. Hawrylo, Trenton, N.J.

[73] Assignee: The United States of America as represented by the Secretary of the Air Force, Washington, D.C.

[21] Appl. No.: 372,364

[22] Filed: Apr. 27, 1982

[51] Int. Cl.³ .............................................. H01S 3/19
[52] U.S. Cl. ...................................... 372/45; 357/17; 372/44
[58] Field of Search ..................... 372/45, 44; 357/16, 357/17, 61, 63

[56] References Cited

U.S. PATENT DOCUMENTS

| | | | |
|---|---|---|---|
| 3,653,989 | 4/1972 | Widmer | 148/189 |
| 3,753,801 | 8/1973 | Lockwood et al. | 148/171 |
| 4,033,796 | 7/1977 | Burnham et al. | 148/175 |
| 4,233,090 | 11/1980 | Hawrylo et al. | 148/171 |
| 4,371,967 | 2/1983 | Wada et al. | 372/45 |

OTHER PUBLICATIONS

Brown, K. E., "Effective Distribution Coefficients of Some Group VI Elements in Indium Phosphide Group by Liquid Phase Epitaxy", Solid State Electronics, 1974, pp. 505–507.

Cusano, D. A., "Radiative Recombination from GaAs Directly Excited by Electron Beams", Solid State Communications, 1964.

Hirtz et al., "Low Threshold GaInAsP/InP Lasers With Good Temperature Dependence Grown by Low Pressure MOVPE", Electronics Letters, vol. 17, No. 3, Feb. 5, 1981, pp. 113-115.

Primary Examiner—James W. Davie
Attorney, Agent, or Firm—Donald J. Singer; Stanton E. Collier

[57] ABSTRACT

A diffusion barrier is created in a n-type heterojunction layer adjacent to the active region of a semiconductor laser by doping the n-type layer with a periodic table group VI element. The diffusion barrier in the n-type layer prevents the migration of acceptors into that layer. The group VI elements are, in particular, sulfur (S), selinium (Se), and tellurium (Te). The acceptor of concern is zinc (Zn).

1 Claim, 1 Drawing Figure

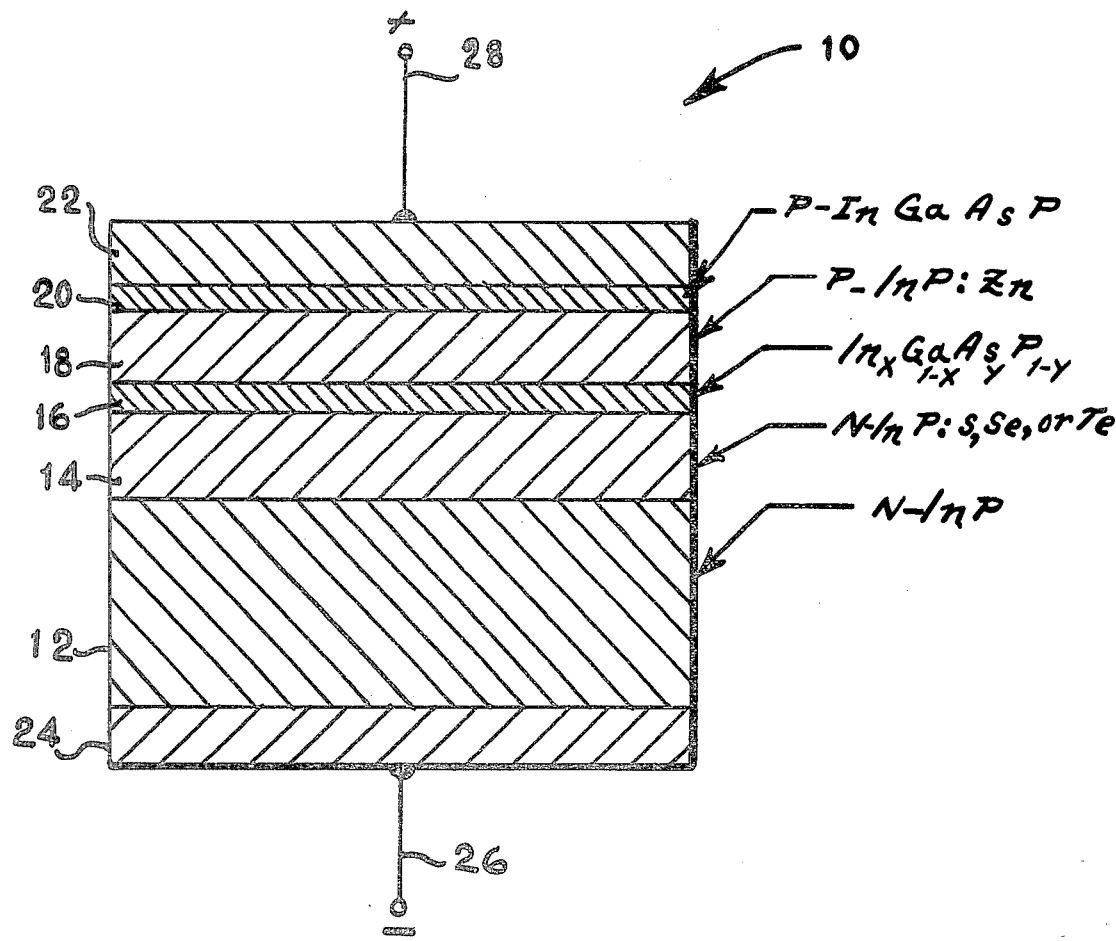

DIFFUSION BARRIER FOR LONG WAVELENGTH LASER DIODES

STATEMENT OF GOVERNMENT INTEREST

The invention described herein may be manufactured and used by or for the Government for governmental purposes without the payment of any royalty thereon.

BACKGROUND OF THE INVENTION

This invention relates to semiconductor devices, and in particular, relates to semiconductor lasers having a diffusion barrier therein.

A semiconductor laser includes an active laser region composed of indium, gallium, arsenic, and phosphorous, for example, and two adjacent layers. One adjacent layer is a n-type semiconductor such as n-type indium phosphide, and the other adjacent layer is a p-type semiconductor such as zinc-doped indium phosphide. In order to form these layers, liquid phase epitaxy is used. Normally, growth temperatures range from about 670 degrees centigrade to about 600 degrees centigrade, and a slow cooling rate, about 0.3 degree centigrade per minute, is employed. When large amounts of zinc, such as 5 milligrams or more, is used to dope the p-type layer, zinc migrates thru the undoped active laser region into the n-type layer heterowall, thereby, placing an effective p-n junction in the n-type layer.

There currently exists, therefore, a need to achieve a higher acceptor concentration in the p-hetero layer and contacting layer surface.

SUMMARY OF THE INVENTION

This invention places a diffusion barrier in the n-type layer adjacent to the active laser cavity region to substantially reduce the migration of zinc therein and thereby overcomes the problems set forth hereinabove.

A semiconductor laser is made by epitaxially depositing in succession on a substrate a plurality of layers of single crystalline semiconductor materials to form an active region having heterojunctions on each side thereof. Group VI elements such as sulfur, selenium, or tellurium are used as dopants for the n-type heterojunction layer. These dopants when properly introduced into the n-type heterojunction layer provide a higher donor concentration (i.e., above the acceptor doping levels which are controlled by the amount of zinc added by weight to the p-type layer solutions) and can act as a barrier lessening the diffuseability of the acceptor into the n-type heterojunction layer.

One object of this invention is to provide a diffusion barrier to zinc-dopant in a semiconductor laser.

Another object of this invention is to provide a diffusion barrier in a semiconductor layer to prevent diffusion of acceptor dopants thereinto.

This and many other objects of the present invention will be readily apparent to one skilled in the art to which the invention pertains from a perusal of the claims and of the following detailed description.

BRIEF DESCRIPTION OF THE DRAWING

The only FIGURE is a cross-section of the semiconductor laser device of this invention.

DETAILED DESCRIPTION OF THE PREFERRED EMBODIMENT

Referring to the only FIGURE of the invention, an application of the diffusion barrier is illustrated in a double heterostructure long wavelength laser structure 10. Although the invention is shown embodied in a laser device structure, it is applicable to other semiconductor devices wherein the diffusion of zinc dopant is a problem.

One attempt to alleviate this problem is to reduce the amount of zinc in the p-type layer. When about 500 micrograms of zinc is added to this layer, a solidus concentration from about mid $10^{17}$ to low $10^{18}$ acceptors per cubic centimeter results. This results in a higher device series resistance and at times causes problems with the metallization process.

In making a laser diode by the method of the present invention the various layers which make up the final laser diode are epitaxially deposited in succession on a substrate 12. The material used to make the laser diode is generally a Group III-V compound or alloys of such compound. The method of the present invention will be described using InP and the alloy $In_xGa_{1-x}As_yP_{1-y}$ wherein x and y can have a range of values. However, as will be explained later other combinations of the Group III-V compounds can be used. Although various epitaxial techniques can be used for depositing the layers, a preferred technique is liquid phase epitaxy (LPE), i.e., depositing the material from the liquid phase.

A suitable apparatus and method for depositing the layers by liquid phase epitaxy is shown and described in U.S. Pat. No. 3,753,801 to H. F. Lockwood et al entitled, "METHOD OF DEPOSITING EPITAXIAL SEMICONDUCTOR LAYERS FROM THE LIQUID PHASE", issued AUG. 21, 1973 which is incorporated herein by reference. Basically, the apparatus includes a furnace boat having a plurality of spaced bins in the top surface thereof and a substrate-carrying slide movable through the furnace boat and across the bottom of each of the bins. Each of the bins contains a liquid source from which a layer is to be deposited. The slide carries the substrate into each of the bins where it is brought into contact with the source to permit the layer to be deposited on the substrate using a supercooling method. For depositing thin layers, shorter growth times or smaller amounts of the solution are used in the bin.

Each of the source solutions is made up of the desired semiconductor material and a suitable conductivity modifier dissolved in a metal solvent. The solutions are heated to a temperature at which the semiconductor material and the conductivity modifier are completely dissolved and homogenized in the solvent. The substrate is moved into each of the bins in succession and, while in contact with the solution in the bin, the temperature of the solution is lowered to precipitate out the semiconductor material and deposit it on the surface of the substrate.

Referring to the FIGURE a layer 14 of indium phosphide containing the n-type dopant is prepared by LPE. This process includes a mixture of the compound to be deposited (InP), a solvent (In), and a dopant (Se, Te, or S). The mixture contains an amount of the group V element (P) sufficient to provide 10 to 20 degrees centigrade solution supercooling at the deposition temperature and an amount of dopant (Se, Te, or S) sufficient to provide the desired dopant concentration in deposited n-type layer 14. To make an effective barrier, the doping level of donors in layer 14 should be higher than the doping level of acceptors in both a p-type heterojunction layer 18 and a p-type capping contact layer 20. The concentration of p-type dopants in layers 14 and 20 is controlled by the amount of dopant added to the growth solutions by weight, and growth temperature. The diffusion of the acceptor dopant is controlled by the growth times, temperature and amount added by weight.

The diffusion of the zinc acceptor from p-type layers 18 and 20, respectively, into the heavier doped n-type heterojunction layer 14 is controlled by the concentration of the dopants. As the donor concentration increases, the concentration of the acceptor can also be increased provided the concentrations are acceptable for material growth and device operation.

Referring to the FIGURE in general, a substrate 12 is of n-type InP and first heterojunction layer 14 of n-type InP is deposited on substrate 12 using the above-described liquid phase epitaxy technique. N-type InP first heterojunction layer 14 is doped with sulfur, selenium, or tellurium to about mid $10^{19}$ atoms per cubic centimeter. A second layer 16 is a thin layer of $In_x Ga_{1-x}As_yP_{1-y}$ alloy (hereinafter shown as InGaAsP) which may be either n-type, p-type, or undoped. Second layer 16 forms the active region of semiconductor laser 10. On second layer 16 is third heterojunction layer 18 which is of p-type InP. First heterojunction layer 14 and third heterojunction layer 18 form conventional heterojunctions with second layer 16. Over third heterojunction layer 18 is a fourth layer 20 of p-type doped InGaAsP which serves as the capping contact layer for semiconductor laser 10. Fourth layer 20 should be of a material having the following characteristics: (1) it should have a band gap lower than that of the material of third heterojunction layer 18; (2) it should readily accept a p-type dopant; (3) it should be highly conductive for low series resistance after metallization; and (4) it should have a lattice parameter preferably the same as, but at least as close as possible to, that of the material of third heterojunction layer 18. For third layer 18 made of InP, InGaAsP meets all of the above preferred chacteristics and is highly suitable for use as fourth layer 20. However, other materials such as InGaAsInAsP, and GaAsSb can also be used for fourth layer 20 when third layer 18 is InP.

First and third heterojunction layers 14 and 18, respectively, of InP can be deposited from a solution of InP in indium as the solvent. Sulfur, selenium, or tellurium may be used as the n-type dopant for first heterojunction layer 14 and zinc for the p-type dopant for third heterojunction layer 18. Second and fourth layers 16 and 20 of InGaAsP can be deposited from a solution of a mixture of InP, InAs and GaAs in indium as the solvent. The solution for the second layer 16 may be undoped or include tin or other suitable donor dopants to achieve an n-type layer and zinc or any other suitable acceptor dopants (i.e., Cd or Mg) to achieve a p-type layer. The solution for the fourth layer 20 may have a p-type dopant.

Layers 14, 16, 18 and 20 are deposited on substrate 12 using LPE in the apparatus noted hereinabove. After the proper materials and amounts are placed in the bins, the heat is turned on for an hour to dissolve and homogenize the materials. After the temperature has remained at 654.8° C. for one hour, it is decreased in a ramp-like manner at about 0.2° C. per minute for about 27 minutes until 650.0° C. is reached. The slide having InP substrate 12 is pulled through the first bin having indium therein to wipe substrate 12. Thereafter, the slide is pulled into the second bin wherein first heterojunction layer 14 is applied. In this example, the melt in the second bin includes 4.9949 grams of indium, 49.7 milligrams of indium phosphide, and 1.6 milligrams of selenium. After lowering the temperature, 0.2° C./min for about 70 minutes, a 7.2 micrometer thick first heterojunction layer 14 is deposited. The slide is then moved into the third bin wherein second layer 16, the active laser region, is deposited. A 0.3 micrometer thick layer of undoped InGaAsP is deposited after three seconds at 635.0° C. Third heterojunction layer 18 is deposited in the fourth bin. The zinc doped indium phosphide third heterojunction layer 18 is 2.5 micrometers thick and is deposited in ten minutes at 635.1° C. Capping contact fourth layer 20 is deposited in the fifth bin. 0.3 micrometers of zinc doped InGaAsP is deposited within ten seconds at 633.1° C.

Finally, as shown in the FIGURE, metal contacts 22 and 24 are then coated on the surface of fourth layer 20 and substrate 12, respectively. Metal contacts 22 and 24 may be of any metal which forms a good ohmic contact with the particular material of the fourth layer 20 and substrate 12. For n-type InP a metal contact of tin alloyed to the InP and covered with a thin layer of nickel coated with a thin layer of gold has been found to be suitable. For the p-type contact 24 an alloy of gold and zinc is suitable. Electrical leads 26 and 28 are attached to metal contacts 24 and 22 respectively for electrical connections.

N-type InP first heterojunction layer 14 can be doped with selenium, tellurium, or sulfur from about 650° C. to about 635° C. InP doped with selenium, tellurium, or sulfur exhibits a light emitting photo luminescence peak from about 7500 A to about 7900 A. This corresponds to about 0.1 to about 0.3 a/o dopants in the solid.

To verify the lack of zinc diffusion, InP was doped with tellurium on a zinc doped substrate. This structure was heat treated in an ampoule at 700 degrees centigrade for one hour. Cross-section and staining techniques did not reveal a diffusion into the n-type layer.

As previously stated, although the laser diode has been described hereinabove as being made of InP and InGaAsP, the method of the present invention can be used to make laser diodes using other Group III-V compounds and alloys thereof.

Obviously, many modifications of the present invention are possible in light of the above teachings and it is understood that, within the scope of the disclosed inventive concept, the invention may be practiced otherwise than specifically described.

What is claimed is:

1. In an improved semiconductor laser diode in which a plurality of layers of semiconductor material are deposited by liquid phase epitaxy on a substrate to form an active lasing layer having heterojunction layers on each side thereof, the improvement comprising:

a first heterojunction layer having an n-type dopant therein to form a diffusion barrier, said first heterojunction layer being deposited on one side of said active lasing layer, said n-type dopant selected from the group consisting of sulfur, selenium and tellurium, the concentration of said n-type dopant being mid $10^{19}$ atoms per cubic centimeter; and a second heterojunction layer having a p-type dopant therein, the concentration of said n-type dopant exceeding the concentration of said p-type dopant so that said p-type dopant does not diffuse into said first heterojunction layer, said second heterojunction layer being deposited on the other side of said active lasing layer.

* * * * *